(12) United States Patent
Ronay et al.

(10) Patent No.: US 11,955,420 B2
(45) Date of Patent: Apr. 9, 2024

(54) STRUCTURES WITH DEFORMABLE CONDUCTORS

(71) Applicant: Liquid Wire Inc., Portland, OR (US)

(72) Inventors: Mark William Ronay, Portland, OR (US); Trevor Antonio Rivera, Portland, OR (US); Michael Adventure Hopkins, Portland, OR (US); Edward Martin Godshalk, Newberg, PA (US); Charles J. Kinzel, Portland, OR (US)

(73) Assignee: Liquid Wire Inc., Portland, OR (US)

( * ) Notice: Subject to any disclaimer, the term of this patent is extended or adjusted under 35 U.S.C. 154(b) by 0 days.

(21) Appl. No.: 18/114,420

(22) Filed: Feb. 27, 2023

(65) Prior Publication Data

US 2023/0290717 A1 Sep. 14, 2023

Related U.S. Application Data

(63) Continuation of application No. 17/395,130, filed on Aug. 5, 2021, now Pat. No. 11,594,480, which is a
(Continued)

(51) Int. Cl.
*H01L 23/498* (2006.01)
*H01L 23/31* (2006.01)
*H01L 21/48* (2006.01)

(52) U.S. Cl.
CPC .... *H01L 23/49838* (2013.01); *H01L 23/3121* (2013.01); *H01L 23/4985* (2013.01); *H01L 23/49861* (2013.01); *H01L 21/4846* (2013.01)

(58) Field of Classification Search
CPC ........... H01L 23/49838; H01L 23/3121; H01L 23/4985; H01L 23/49861; H01L 21/4846
See application file for complete search history.

(56) References Cited

U.S. PATENT DOCUMENTS

| 4,729,003 A | 3/1988 | Schulte et al. |
| 5,056,706 A | 10/1991 | Dolbear et al. |

(Continued)

FOREIGN PATENT DOCUMENTS

| CN | 101505575 B | 1/2011 |
| CN | 112956283 A | 6/2021 |

(Continued)

OTHER PUBLICATIONS

"U.S. Appl. No. 16/548,379, Examiner Interview Summary dated Dec. 4, 2020", 3 pgs.
(Continued)

*Primary Examiner* — Peniel M Gumedzoe
(74) *Attorney, Agent, or Firm* — Schwegman Lundberg & Woessner, P.A.

(57) ABSTRACT

A circuit assembly may include a substrate and a pattern of contact points formed from deformable conductive material supported by the substrate. The assembly may further include an electric component supported by the substrate and having terminals arranged in a pattern corresponding to the pattern of contacts points. The one or more of the terminals of the electric component may contact one or more of the corresponding contact points to form one or more electrical connections between the electric component and the contact points.

20 Claims, 15 Drawing Sheets

Related U.S. Application Data continuation of application No. 16/548,379, filed on Aug. 22, 2019, now Pat. No. 11,088,063.

(60) Provisional application No. 62/721,538, filed on Aug. 22, 2018.

(56) References Cited

U.S. PATENT DOCUMENTS

| | | | |
|---|---|---|---|
| 5,131,141 | A | 7/1992 | Kawaguchi |
| 5,198,189 | A | 3/1993 | Booth et al. |
| 5,391,846 | A | 2/1995 | Taylor et al. |
| 5,478,978 | A | 12/1995 | Taylor et al. |
| 5,498,575 | A | 3/1996 | Onishi et al. |
| 5,792,236 | A | 8/1998 | Taylor et al. |
| 5,961,144 | A | 10/1999 | Desmarais |
| 6,051,093 | A | 4/2000 | Tsukakara |
| 6,507,095 | B1 | 1/2003 | Hashimoto |
| 6,781,284 | B1 | 8/2004 | Pelrine et al. |
| 6,812,624 | B1 | 11/2004 | Pei et al. |
| 7,509,835 | B2 | 3/2009 | Beck |
| 7,703,333 | B2 | 4/2010 | Hayakawa et al. |
| 7,854,173 | B2 | 12/2010 | Cheng et al. |
| 8,069,735 | B1 | 12/2011 | Egorov et al. |
| 8,329,493 | B2 | 12/2012 | Mascaro et al. |
| 8,680,876 | B2 | 3/2014 | Kadono |
| 8,931,351 | B2 | 1/2015 | Muramatsu et al. |
| 9,671,297 | B2 | 6/2017 | Sibbett |
| 9,753,568 | B2 | 9/2017 | Mcmillen |
| 9,820,055 | B2 | 11/2017 | Babayoff et al. |
| 10,039,186 | B2 | 7/2018 | Baxi et al. |
| 10,275,069 | B2 | 4/2019 | Smith |
| 10,555,609 | B2 | 2/2020 | Park et al. |
| 10,617,809 | B2 | 4/2020 | Weaver et al. |
| 10,641,666 | B2 | 5/2020 | Kim et al. |
| 10,672,530 | B2 | 6/2020 | Ronay |
| 10,716,884 | B2 | 7/2020 | Weaver et al. |
| 11,088,063 | B2 | 8/2021 | Ronay et al. |
| 11,156,509 | B2 | 10/2021 | Ronay |
| 11,222,735 | B2 | 1/2022 | Ronay |
| 11,594,480 | B2 | 2/2023 | Ronay et al. |
| 2001/0003373 | A1 | 6/2001 | Akram |
| 2002/0194731 | A1 | 12/2002 | Anderson |
| 2003/0178726 | A1* | 9/2003 | Ogawa .............. H01L 24/24 257/E23.062 |
| 2005/0072595 | A1 | 4/2005 | Cho |
| 2007/0107933 | A1 | 5/2007 | Yamamoto et al. |
| 2007/0151756 | A1 | 7/2007 | Yamashita et al. |
| 2009/0120564 | A1 | 5/2009 | Halope et al. |
| 2009/0149023 | A1 | 6/2009 | Koyanagi |
| 2009/0273083 | A1 | 11/2009 | Sauciuc et al. |
| 2010/0052163 | A1 | 3/2010 | Ouchi |
| 2014/0238340 | A1 | 8/2014 | Dunn et al. |
| 2015/0055309 | A1 | 2/2015 | Bae et al. |
| 2015/0085457 | A1 | 3/2015 | Ju |
| 2016/0211205 | A1 | 7/2016 | Nagatomo et al. |
| 2016/0322283 | A1 | 11/2016 | Mcmahon et al. |
| 2016/0343762 | A1 | 11/2016 | Kagawa et al. |
| 2017/0323714 | A1 | 11/2017 | Lazarus et al. |
| 2018/0013251 | A1 | 1/2018 | Seo et al. |
| 2018/0076336 | A1 | 3/2018 | De Graff et al. |
| 2020/0066628 | A1 | 2/2020 | Ronay et al. |
| 2022/0068787 | A1 | 3/2022 | Ronay et al. |

FOREIGN PATENT DOCUMENTS

| | | |
|---|---|---|
| DE | 20007729 U1 | 8/2000 |
| JP | 2000183092 A | 6/2000 |
| JP | 2000286555 A | 10/2000 |
| JP | 2016143763 A | 8/2016 |
| JP | 2021534596 A | 12/2021 |
| JP | 7269347 B2 | 4/2023 |
| JP | 2023100723 | 7/2023 |
| WO | WO-2015151433 A1 | 10/2015 |
| WO | WO-2018145106 A1 | 8/2018 |
| WO | WO-2020041605 A1 | 2/2020 |

OTHER PUBLICATIONS

"U.S. Appl. No. 16/548,379, Final Office Action dated Mar. 16, 2021", 10 pgs.

"U.S. Appl. No. 16/548,379, Non Final Office Action dated Sep. 4, 2020", 12 pgs.

"U.S. Appl. No. 16/548,379, Notice of Allowance dated Apr. 21, 2021", 8 pgs.

"U.S. Appl. No. 16/548,379, Preliminary Amendment filed Nov. 4, 2019", 7 pgs.

"U.S. Appl. No. 16/548,379, Response filed Apr. 9, 2021 to Final Office Action dated Mar. 16, 2021", 5 pgs.

"U.S. Appl. No. 16/548,379, Response filed Dec. 3, 2020 to Non Final Office Action dated Sep. 4, 2020", 8 pgs.

"U.S. Appl. No. 16/548,379, Third Party Submission Under 37 CFR 1.290 mailed Jul. 15, 2020", 4 pgs.

"U.S. Appl. No. 17/395,130, Corrected Notice of Allowability dated Dec. 23, 2022", 7 pgs.

"U.S. Appl. No. 17/395,130, Notice of Allowance dated Sep. 22, 2022", 10 pgs.

"U.S. Appl. No. 17/395,130, Preliminary Amendment filed Nov. 18, 2021", 5 pgs.

"Design Standard for Printed Electronics on Flexible Substrates", IPC-2292, (Mar. 2018), 4 pgs.

"European Application Serial No. 19853236.8, Extended European Search Report dated Sep. 26, 2022", 12 pgs.

"European Application Serial No. 19853236.8, Partial Supplementary European Search Report dated May 2, 2022", 11 pgs.

"European Application Serial No. 19853236.8, Response filed Apr. 24, 2023 to Extended European Search Report dated Sep. 26, 2022", 10 pgs.

"European Application Serial No. 19853236.8, Response filed Sep. 29, 2021 to Communication pursuant to Rules 161(2) and 162 EPC", 16 pgs.

"International Application Serial No. PCT/US2019/047731, International Preliminary Report on Patentability dated Mar. 4, 2021", 12 pgs.

"International Application Serial No. PCT/US2019/047731, International Search Report dated Dec. 13, 2019", 5 pgs.

"International Application Serial No. PCT/US2019/047731, Written Opinion dated Dec. 13, 2019", 10 pgs.

"Japanese Application Serial No. 2021-533390, Notification of Reasons for Refusal dated Sep. 27, 2022", w/ English translation, 8 pgs.

"Japanese Application Serial No. 2021-533390, Response filed Dec. 22, 2022 to Notification of Reasons for Refusal dated Sep. 27, 2022", w/ English Claims, 9 pgs.

"Japanese Application Serial No. 2021-533390, Voluntary Amendment filed Aug. 25, 2022", w/o English Claims, 9 pgs.

"Japanese Application Serial No. 2023-069953, Voluntary Amendment filed May 19, 2023", w/ English Claims, 5 pgs.

Boley, William J, et al., "Direct Writing of Gallium-Indium Alloy for Stretchable Electronics", Advanced Functional Materials, vol. 24, No. 23, (Jun. 1, 2014), 3501-3507.

Kim, Min-Gu, "Multiscale and Uniform Liquid Metal Thin-Film Patterning Based on Soft Lithography for 3D Heterogeneous Integrated Soft Microsystems: Additive Stamping and Subtractive Reverse Stamping", Wiley-VCH, Germany, (May 17, 2018), 10 pgs.

Larmagnac, Alexandre, "Stretchable electronics based on Ag-PDMS composites", Nature Publishing Group, United Kingdom, (Dec. 1, 2014), 7 pgs.

Lu, Tong, "Rapid Prototyping for Soft-Matter Electronics", Wiley-VCH, Germany, (Feb. 21, 2014), 6 pgs.

Lu, Tong, "Soft-Matter Printed Circuit Board with UV Laser Micropatterning", American Chemical Society, United States, (Jun. 12, 2017), 8 pgs.

Nagels, Steven, "Silicone Devices: A Scalable DIY Approach for Fabricating Self-Contained Multi-Layered Soft Circuits using Microfluidics", Association of Computing Machinery, Unites States, (Apr. 26, 2018), 13 pgs.

(56) References Cited

OTHER PUBLICATIONS

Ozutemiz, Bugra, "EGaln-Metal Interfacing for Liquid Metal Circuitry and Microelectronics Integration", Wiley-VCH, Germany, (Mar. 15, 2018), 13 pgs.

* cited by examiner

STRUCTURES WITH DEFORMABLE CONDUCTORS

CROSS-REFERENCE TO RELATED APPLICATIONS

This application is a continuation of U.S. patent application Ser. No. 17/395,130, filed Aug. 5, 2021, which application is a continuation of U.S. patent application Ser. No. 16/548,379, filed Aug. 22, 2019, issued on Aug. 10, 2021 as U.S. Pat. No. 11,088,063 which application claims the benefit of priority from U.S. Provisional Patent Application Ser. No. 62/721,538 filed Aug. 22, 2018, all of which are incorporated by reference.

COPYRIGHTS

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND

The inventive principles of this patent disclosure relate generally to deformable conductive materials, and more specifically to structures having electrical connections and/or layers with deformable conductive materials, and methods of forming such structures.

SUMMARY

A circuit assembly may include a substrate and a pattern of contact points formed from deformable conductive material supported by the substrate. The assembly may also include an electric component supported by the substrate and having terminals arranged in a pattern corresponding to the pattern of contacts points. One or more of the terminals of the electric component contacts one or more of the corresponding contact points to form one or more electrical connections between the electric component and the contact points. The assembly may further include a pattern of conductive traces formed from deformable conductive material supported by the substrate, wherein the pattern of conductive traces is interconnected with the pattern of contact points. The assembly may further include an encapsulant covering the electric component and contact points. The may be contact points may be formed on the substrate. The contact points may be formed on a surface of the substrate. The contact points may be recessed in the substrate. The assembly may further include a layer of insulating material supported by the substrate, and contact points may be recessed in the layer of insulating material. The contact points may be formed by vias in the layer of insulating material. The electric device may include a surface mount component. The electric device may include an integrated circuit in a package. The electric device may include a bare integrated circuit die. The substrate may include a flexible material. The substrate may include a stretchable material. At least a portion of the substrate may have an adhesive property. The electric component may be attached to the substrate by the adhesive property.

A circuit assembly may include a substrate, a first layer of insulating material supported by the substrate and having a pattern of channels formed therein, and deformable conductive material disposed within the channels. The assembly may further include a second layer of insulating material arranged to enclose the deformable conductive material disposed within the channels of the first insulating layer. The second layer of insulating material may include a pattern of contact points interconnected with the channels. The second layer of insulating material may include a pattern of vias aligned with the pattern of channels of the first insulating layer. The assembly may further include a third layer of insulating material supported by the second layer of insulating material and having a pattern of channels formed therein. The second layer of insulating material may include a pattern of vias aligned with the pattern of channels of the first insulating layer and the pattern of channels of the third insulating layer. The third layer of insulating material may include a pattern of contact points interconnected with the channels of the third layer of insulating material. The second layer of insulating material may include a second pattern of vias aligned with the pattern of channels of the first layer of insulating material, the third layer of insulating material may include a pattern of vias aligned with the second pattern of vias in the second layer of insulating material, and the pattern of contact points of the third layer of insulating material may include one or more of the pattern of vias of the third layer of insulating material. The assembly may further include a fourth layer of insulating material arranged to enclose the deformable conductive material disposed within the channels of the third insulating layer. The fourth layer of insulating material may include a pattern of vias aligned with the pattern of channels of the third insulating layer. The second, third and fourth layers of insulating material include patterns of vias that align with each other and with the channels of the first insulating layer. The assembly may further include an electric component supported by the fourth layer of insulating material, the electric component having a pattern of terminals, and two or more of the vias through the fourth layer of insulating material form a pattern of contact points that correspond to the pattern of terminals of the electric component.

A circuit assembly may include a substrate, and a first layer of insulating material attached to the substrate and having a first pattern of passages containing deformable conductive material. The circuit assembly may further include a second layer of insulating material attached to the first layer of insulating material and having a second pattern of passages containing deformable conductive material, wherein the second pattern of passages communicates at least partially with the first pattern of passages. The first pattern of passages may include one or more traces, and the second pattern of passages may include one or more vias. The circuit assembly may further include a third layer of insulating material attached to the second layer of insulating material and having a third pattern of passages containing deformable conductive material, wherein the third pattern of passages communicates at least partially with the second pattern of passages. The first pattern of passages may include one or more traces, the second pattern of passages may include one or more vias, and the third pattern of passages may include one or more traces. The circuit assembly may further include a fourth layer of insulating material attached to the third layer of insulating material and having a fourth pattern of passages containing deformable conductive material, wherein the fourth pattern of passages communicates at least partially with the third pattern of passages. The first pattern of passages may include one or more traces, the second pattern of passages may include one or more vias, the third pattern of passages may include one or more traces, and the fourth pattern of passages may include one or more vias.

A method may include stacking a first layer of insulating material having one or more passages on a substrate, depositing a deformable conductive material in at least one of the passages in the first insulating layer, and stacking a second layer of insulating material on the first layer of insulating material, wherein the second layer of insulating material at least partially encloses the deformable conductive material in the at least one passage in the first layer of insulating material. At least one of the passages in the first layer of insulating material may pass through the entire thickness of the first layer of insulating material.

Depositing the deformable conductive material in at least one of the passages in the first insulating layer may include overfilling the at least one passage with deformable conductive material, and removing excess deformable conductive material from a surface of the first layer of insulating material. Removing excess deformable conductive material from the surface of the first layer of insulating material may include removing a release layer from the surface of the first layer of insulating material. The second layer of insulating material may have one or more passages, and the method further may include depositing a deformable conductive material in at least one of the passages in the second insulating layer, and stacking a third layer of insulating material on the second layer of insulating material, wherein the third layer of insulating material at least partially encloses the deformable conductive material in the at least one passage in the second layer of insulating material. At least one of the passages in the first insulating layer may communicate with the at least one of the passages in the second insulating layer. At least one of the passages in the second layer of insulating material may pass through the entire thickness of the second layer of insulating material. The third layer of insulating material may have one or more passages, and the method further may include depositing a deformable conductive material in at least one of the passages in the third insulating layer, and stacking a fourth layer of insulating material on the third layer of insulating material, wherein the fourth layer of insulating material at least partially encloses the deformable conductive material in the at least one passage in the third layer of insulating material.

A method may include forming at least one contact point on a substrate, the contact point having a deformable conductive material, and supporting an electric component on the substrate, the electric component having at least one terminal, wherein at least one terminal of the electric component contacts at least one of the contact points to form at least one electrical connection between the electric component and the contact point. The at least one terminal may include multiple terminals arranged in a pattern, the at least one contact point may include multiple contact points having a deformable conductive material and arranged in a pattern corresponding to the pattern of terminals of the electric component, and the multiple terminals of the electric component may contact the multiple contact points to form multiple electrical connections the electric component and the contact points.

BRIEF DESCRIPTION OF THE DRAWINGS

FIGS. 7A and 7B through 15A and 15B illustrate embodiments of circuit assemblies and embodiments of a methods for fabricating the circuit assemblies according to some inventive principles of this patent disclosure.

DETAILED DESCRIPTION

The embodiments and example implementation details described below arm for purposes of illustration.

The drawings are not necessarily shown to scale. The inventive principles are not limited to these embodiments and details.

Some of the inventive principles of this patent disclosure relate to electrical connections between components and deformable conductive materials in circuit assemblies.

Figure 1:
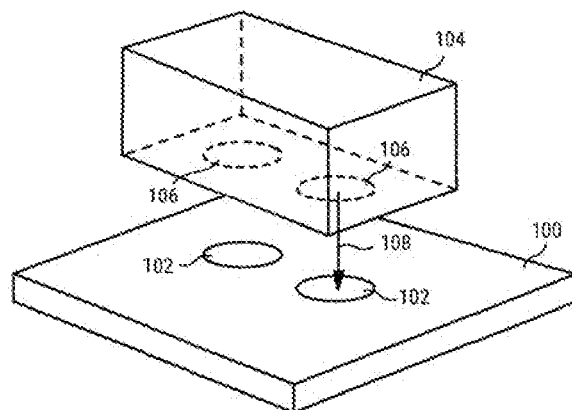
FIG. 1 is an exploded view illustrating an embodiment of a circuit assembly according to some inventive principles of this patent disclosure.

FIG. 1 is an exploded view illustrating an embodiment of a circuit assembly according to some inventive principles of this patent disclosure. The embodiment of FIG. 1 includes a substrate 100 having a pattern of contact points 102 formed from deformable conductive material and supported by the substrate. An electric component 104 is also supported by the substrate 100 and has one or more terminals 106 arranged in a pattern corresponding to the pattern of contacts points 102. The terminals 106 are shown with dashed lines (phantom view-) as they are located on the bottom of the electric component 104. One or more of the terminals 106 of the electric component 104 may contact one or more of the corresponding contact points 102 to form one or more electrical connections between the electric component and the contact points.

The one or more terminals 106 may contact one or more of contact points 102, for example, as the electric component 104 is attached to, brought closer to, or otherwise supported by, the substrate 100 as shown by arrow 108. Some of the inventive principles may thus enable the creation of electrical connections without soldering or any other conventional process for creating electrical connections.

The contact points 102 may be supported by the substrate 100, for example, by being formed directly on the surface of the substrate, by being recessed into the substrate, by being formed on another layer of material above the substrate, or in other ways. The electric component 104 may be supported by the substrate 100, for example, by being attached directly to the surface of the substrate, by being attached to another component that is supported by the substrate, by being supported by the pattern of contact points 102, or in other ways.

The assembly of FIG. 1 may further include a pattern of conductive traces formed from deformable conductive material and supported by the substrate. The pattern of conductive traces may be interconnected with the pattern of contact points.

The embodiment of FIG. 1 may be implemented with a wide variety of materials and components. For example, the substrate may be fabricated from natural or synthetic rubber or plastic materials including any silicone based materials such as polydimethylsiloxane (PDMS), thermoplastic polyurethane (TPU), ethylene propylene diene terpolymer (EPDM), neoprene, polyethylene terephthalate (PET) as well as epoxies and epoxy based materials, fabrics, wood, leather, paper, fiberglass and other composite materials, and other insulating materials and/or combinations thereof.

The deformable conductive materials may be provided in any form including liquid, paste, gel, powder, or other form having a soft, flexible, stretchable, bendable, elastic, flowable viscoelastic, or otherwise deformable characteristic including Newtonian and non-Newtonian characteristics. The deformable conductive materials may be realized with any electroactive materials including, but not limited to, deformable conductors including conductive gels such as gallium indium alloys (also referred to by the trademark "Metal Gel"), some examples of which are disclosed in International Patent Application PCT/US2017/019762 filed Feb. 27, 2017 which is incorporated by reference and was published on Sep. 8, 2017 as International Publication No. WO 2017/151523 A1 which is also incorporated by reference. Other suitable electroactive materials may include any conductive metals including gold, nickel, silver, platinum, copper, etc.; semiconductors based on silicon, gallium, germanium, antimony, arsenic, boron, carbon, selenium, sulfur, tellurium, etc., semiconducting compounds including gallium arsenide, indium antimonide, and oxides of many metals; organic semiconductors; and conductive nonmetallic substances such as graphite. Other examples of conductive gels include gels based on graphite or other allotropes of carbon, ionic compounds or other gels.

The electric component may be any electrical, electronic, electromechanical, or other electric devices including but not limited to integrated circuits, transistors, diodes, LEDs, capacitors, resistors, inductors, switches, terminals, connectors, displays, sensors, printed circuit boards, or other devices. The electric components may be in the form of bare components, or they may be partially or fully enclosed in various types of packages. In the case of integrated circuits and other semiconductors, a wide range of package types may be used as described in more detail below. Integrated circuits in the form of bare dies or dies mounted on substrates but not fully enclosed in a package such as chip-scale device may also be used.

The pattern of contact points may include any number and arrangement of contact points, including a single contact point, depending on number and arrangement of terminals on the electric component or components and the number and arrangement of electrical connections.

Figure 2:
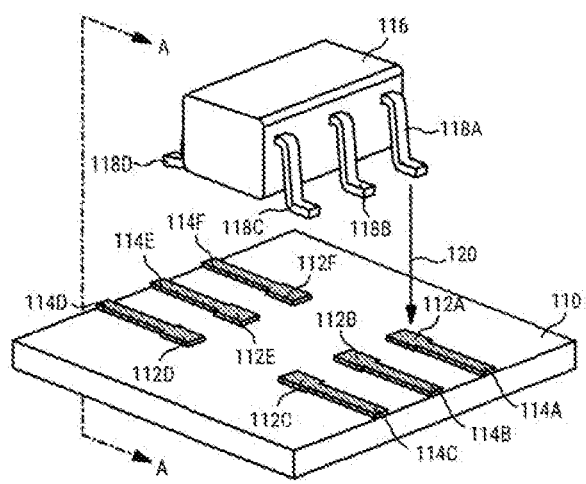
FIG. 2 is a partially exploded perspective view of an example embodiment of a circuit assembly according to some inventive principles of this patent disclosure.

FIG. 2 is a partially exploded perspective view of an example embodiment of a circuit assembly according to some inventive principles of this patent disclosure. The embodiment of FIG. 2 includes an integrated circuit (IC) 116 in a surface mount package having terminals in the form of leads 118A-118F. A substrate 110 has a pattern of contact points 112A-112F (also referred to collectively as 112) made from deformable conductive material and arranged to match the footprint of the leads 118A-118F (also referred to collectively as 118) on integrated circuit 116. In this example, the contact points are formed in the shape of solder pads which would conventionally be used to make electrical connections between the IC and a printed circuit board. Conductive traces 114A-114F (also referred to collectively as 114), which may also be made from deformable conductive material, are connected to the contact points 112A-112F and end at the edges of the substrate 110 in this cutaway view. The traces 114A-114F may be used, for example, to connect the integrated circuit 116 to other components, circuitry, terminals, etc. The leads 118A-118F contact the corresponding contact points 112A-112F when the integrated circuit 116 is placed onto the substrate as shown by arrow 120.

In the embodiment of FIG. 2, the contact points 112 and traces 114 are formed on the top surface of, and protrude above, the substrate 110 by, for example, flexographic printing, block printing, jet printing, 3-D printing, stenciling, masked spraying, extruding, rolling, or brushing, screen printing, pattern deposition, or any other suitable technique.

FIGS. 3A-3E are cross-sectional views taken through line A-A in FIG. 2 showing some possible example implementation details and alternative embodiments.

Figure 3A:
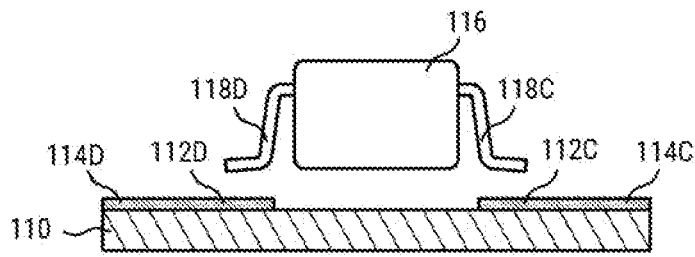
FIGS. 3A through 3E are cross-sectional views taken through line A-A in FIG. 2 showing some possible example implementation details and alternative embodiments according to some inventive principles of this patent disclosure.

In FIG. 3A, the IC 116 is shown prior to placement on the substrate 110.

Figure 3B:
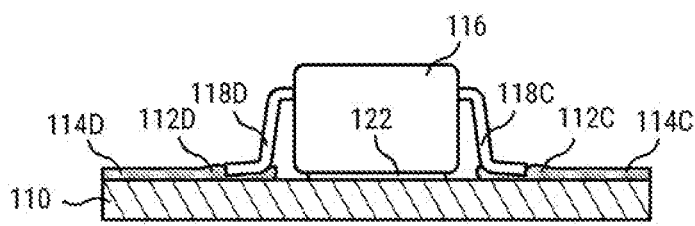

FIG. 3B shows the IC 116 placed on the substrate 110 and forming ohmic contacts between the leads 118 and contact points 112. The IC 116 is secured to the substrate 110 by a layer of adhesive 122. In this example, the leads 118 have displaced some of the deformable conductive material of the contact points 112 which may conform to the shape of the leads 118 and may provide additional surface area and improved electrical connections.

Figure 3C:
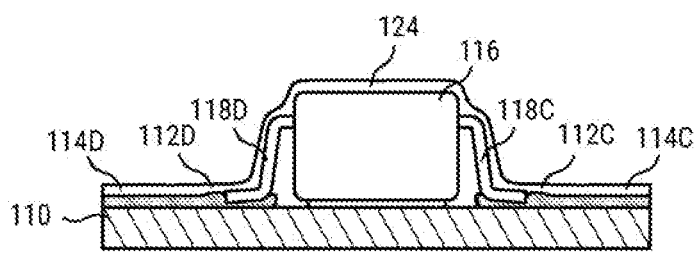

FIG. 3C illustrates an embodiment similar to that of FIG. 3B but with an encapsulant 124 covering the integrated circuit 116, leads 118, contact points 112 and traces 114. The encapsulant 124 may also fill the space between the integrated circuit 116, leads 118 and substrate 110. Examples of materials suitable for encapsulant 124 include silicone based materials such as PDMS, urethanes, epoxies, polyesters, polyamides, varnishes, and any other material that may provide a protective coating and/or help hold the assembly together.

Figure 3D:
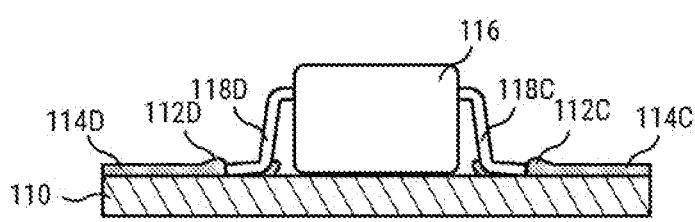

FIG. 3D illustrates an embodiment in which the integrated circuit 116 directly contacts the substrate 110 which may be used, for example, with a substrate 110 made from an inherently adhesive or sticky material, or when an encapsulant will provide adequate strength for holding the integrated circuit 116 to the substrate 110. In this embodiment, the leads 118 may press further into the contact points 112.

Figure 3E:
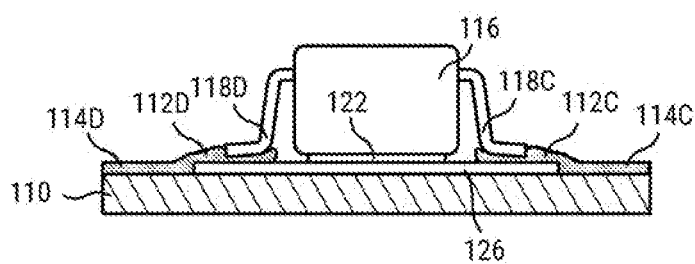

FIG. 3E illustrates an embodiment in which an additional layer of material 126 is attached to the upper surface of the substrate 110 and located under the pattern of contact points 112. The layer 126 may perform various functions. For example, in an implementation in which the substrate is fabricated from a flexible or stretchable material, layer 126 may be made from a more rigid or less stretchable material to prevent flexing or stretching of the region of the substrate directly under the integrated circuit or other electric component which may possibly cause failure of the connections between terminals 118 of the integrated circuit 116 and the contact points 112. As another example, the layer 126 may perform a heat sinking or heat dissipating function for the integrated circuit 116 or other electric component. The additional layer 126 may alternatively be located under the substrate 110, within the substrate, or in any other suitable location. The layer 126 may be formed as a continuous sheet of material, or it may be patterned, for example, with openings for any or all of the contact points 112, traces 114, integrated circuit 116, or other components. Examples of materials that may be used for the layer 126 include some forms of TPU, fiberglass, PET, and other relatively rigid or non-stretchable materials.

Figure 4:
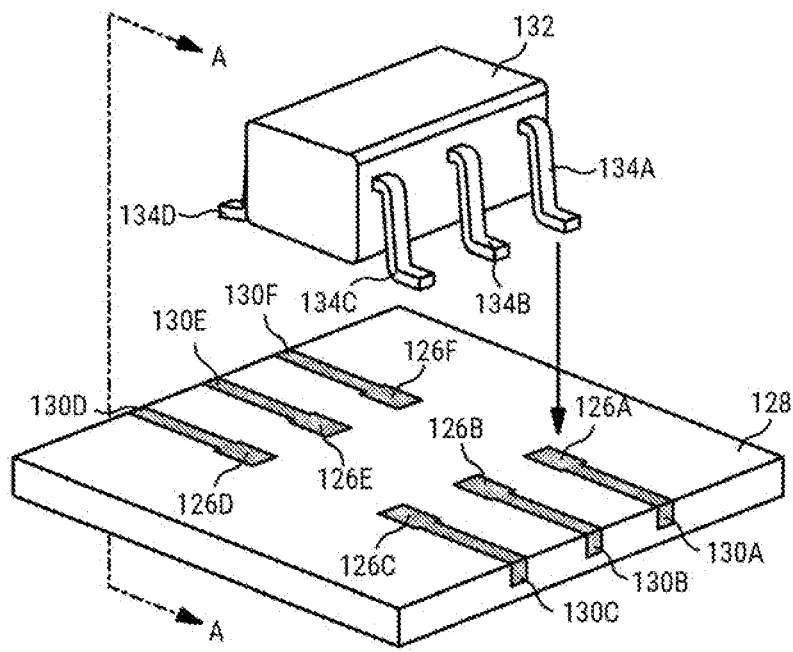
FIG. 4 is a partially exploded perspective view of another example embodiment of a circuit assembly according to some inventive principles of this patent disclosure.

FIG. 4 is a partially exploded perspective view of another example embodiment of a circuit assembly according to some inventive principles of this patent disclosure. The embodiment of FIG. 4 is similar to that of FIG. 2, but the contact points 126A-F are formed by recesses in the substrate 128 that are partially or fully filled with deformable conductive material. The embodiment of FIG. 4 also includes traces 130 that are recessed in the substrate.

The recesses in the substrate may be formed by removing portions of a sheet of material by drilling, routing, etching, cutting or any other method of removing material with mechanical optical (e.g. laser), chemical, electrical, ultrasound or other apparatus or combination thereof. Alternatively, the substrate may be formed with recesses in it by molding, casting, 3-D printing, or other formation process. The deformable conductive material may be deposited in the recesses through any of the processes mentioned above including printing, stenciling, spraying, rolling, brushing, and any other technique for depositing material in the recesses. Additionally, the recesses may be overfilled with deformable conductive material and then any suitable technique including scraping, rolling, brushing, etc. may be used to remove excess material so that it is flush with, or slightly above or below the surrounding surface of the substrate as described in more detail below.

Figure 5A:
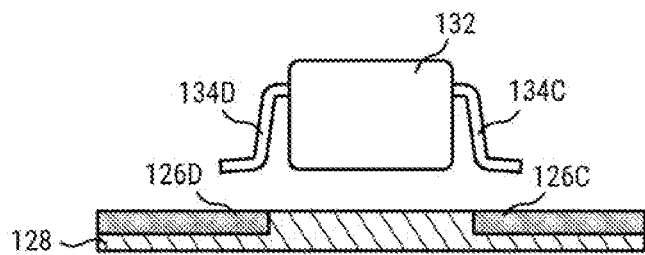
FIGS. 5A-5C are cross-sectional views taken through line A-A in FIG. 4 showing some possible example implementation details and alternative embodiments according to some inventive principles of this patent disclosure.
Figure 5B:
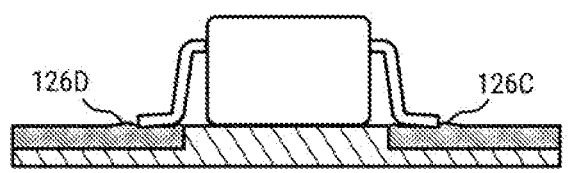
Figure 5C:
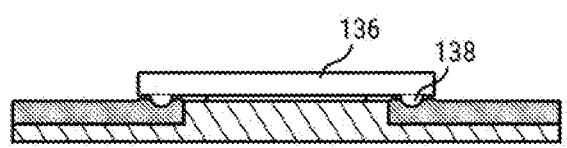

FIGS. 5A-5C are cross-sectional views taken through line A-A in FIG. 4 showing some possible example implementation details and alternative embodiments.

In FIG. 5A, the IC 132 is shown prior to placement on the substrate 128.

FIG. 5B shows the IC 132 placed on the substrate 128 and forming ohmic contacts between the leads 134 and contact points 126. In this example the IC 132 is mounted directly to the substrate 110 which may, for example, have a self-adhesive surface. Alternatively, the IC 132 may be attached to the substrate using adhesives or any other suitable technique. In this example, the leads 134 protrude downward into the contact points 126 and displace some of the deformable conductive material which may conform to the shape of the leads 134 and may provide additional surface area and improved electrical connections.

The integrated circuits shown in FIGS. 2, 3A-3E, 4, and 5A-5B are packaged in surface mount package such as the SOT23-6 (small outline transistor, six lead) package, but any other types of IC packages and electronic components may be used in accordance with the inventive principles of this patent disclosure. For example, lead-less chip carriers may have terminals with flat lead surfaces that provide a good interface to any of the disclosed contact points without disrupting the patterns of deformable conductive material. Some other types of packages that may work well include packages with protruding solder structures such as ball grid arrays (BGAs) and wafer-level chip-scale packaging (WL-CSP), and packages with slightly protruding leads such as leaded chip carriers, since the solder structures or leads may sink slightly into the contact points to create reliable ohmic connections without displacing so much of the deformable conductive material that it disrupts the patterns.

FIG. 5C illustrates an embodiment in which a chip-scale package 136 with solder bumps 138 is adhered to the substrate 128.

Figure 6:
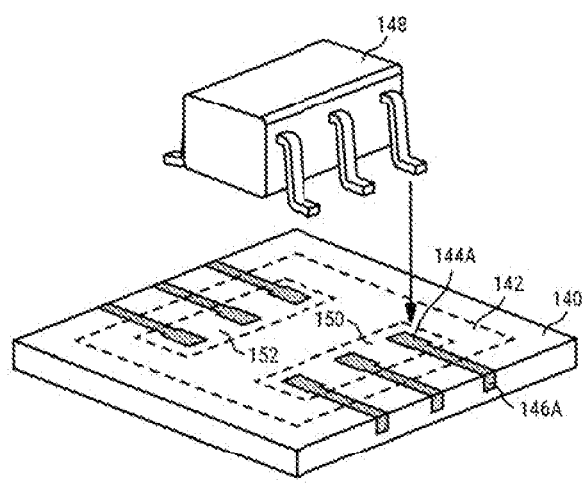
FIG. 6 is a partially exploded perspective view of another example embodiment of a circuit assembly according to some inventive principles of this patent disclosure.

FIG. 6 illustrates an embodiment in which an additional layer of material 142 is attached to the surface of the substrate 140 after formation of the pattern of contact points 144 and traces 146, but before attachment of the integrated circuit 148. The layer 142 may be similar, for example, to the layer 126 in the embodiment of FIG. 3E. In this embodiment, the layer 142 includes openings for the contact points 144.

In addition to packaged integrated circuits and other devices, bare integrated circuit dies and other components may be used in accordance with the inventive principles of this patent disclosure. For example, an IC die having bonding or contact pads may be attached to a substrate having a flush or protruding pattern of contact points that corresponds to the pattern of bonding or contact pads on the die. This may typically require that the die may be mounted upside down (that is, with the bonding or contact pads facing the top surface of the substrate) such that the contact points with deformable conductive material form ohmic connections with the bonding or contact pads.

Although the deformable conductive material is generally shown as being flush with surface of the substrate in the embodiments of FIGS. 4, 5A-5C and 6, the deformable conductive material may alternatively be formed shy of (i.e., recessed below) or proud of (i.e., protruding above) the surface of the substrate. Material may be formed shy of the surface, for example, by only partially filling some or all of the recesses with material, or by removing some material by scraping, brushing, gouging, etching, evaporating, etc. Material may be formed proud of the surface by pattern depositing, stenciling, various forms of printing, etc. In some embodiments, material may be formed proud of the surface by using a release layer with a pattern that matches the pattern of the recesses. The release layer may be positioned over the substrate and the pattern of recesses may be over-filled and then scraped flush with the top surface of the release layer. The release layer may then be removed to leave protruding material in a manner similar to the embodiments described below.

The contact points and traces are generally shown on the surface of, or extending part way into, the substrate in the embodiments of FIGS. 2, 3A-3E, 4, 5A-5C, and 6. In other embodiments, some or all of the contact points and/or traces may extend through the entire thickness of substrate. For example, contact points may be implemented as vias through the substrate, which, in turn, may serve as a layer in one of the embodiments described below.

Some additional inventive principles of this patent disclosure relate to circuit assemblies having layers with passageways containing deformable conductive materials. The inventive principles relating to electrical connections and the inventive principles relating layers with passageways are independent principles having independent utility. However, some additional inventive principles of his patent disclosure may combine some of these separate principles resulting in more inventive principles in ways that may provide synergistic results.

FIGS. 7A and 7B through 15A and 15B illustrate embodiments of circuit assemblies and embodiments of a methods for fabricating the circuit assemblies according to some inventive principles of this patent disclosure. FIGS. 7B, 8B, 9B, 10B, 11B, 12B, 13B, 14B and 15B are cross-sectional views taken through line A-A in the perspective views of FIGS. 7A, 8A, 9A, 10A, 11A, 12A, 13A, 14A and 15A, respectively.

Figure 7A:
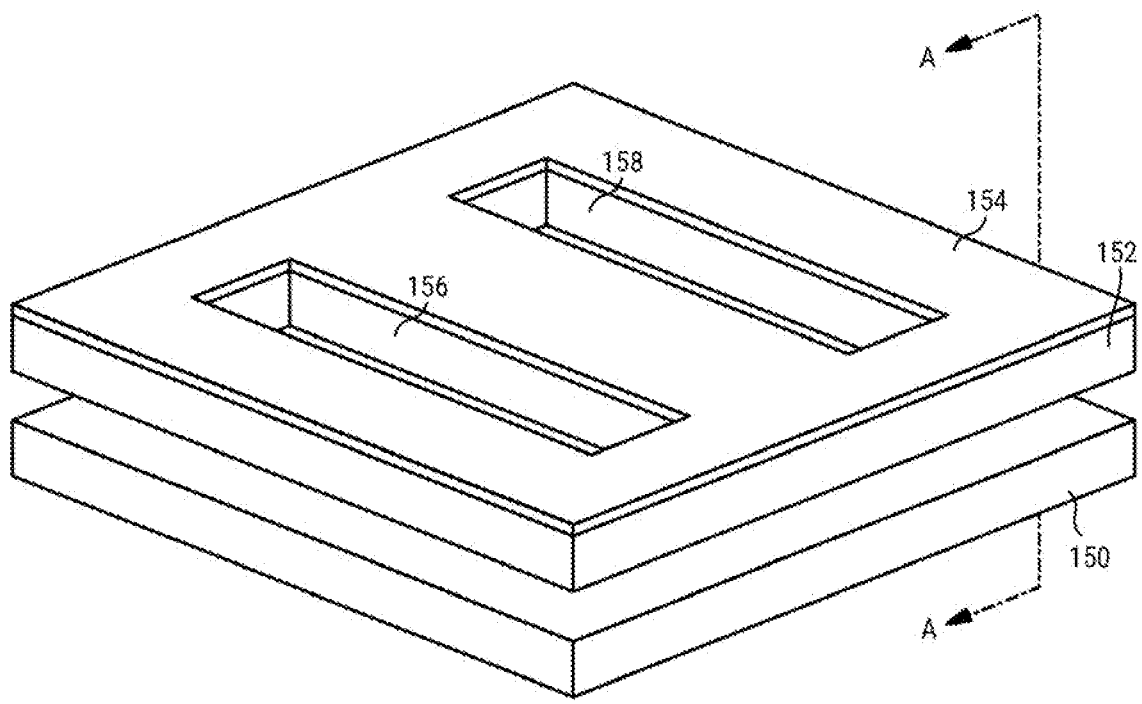
Figure 7B:
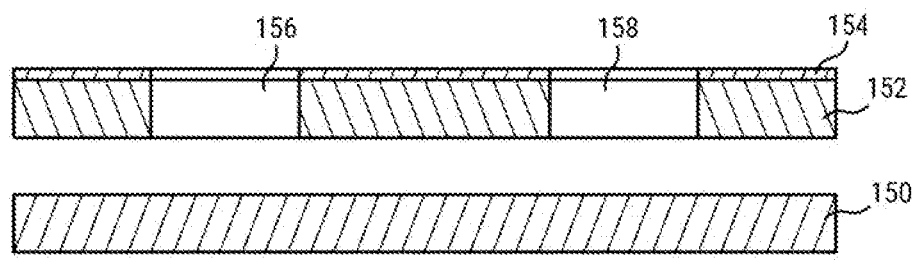

FIG. 7A is a perspective view of a substrate 150, a first layer 152 of insulating material, and a release layer 154. FIG. 7B is a cross-sectional view taken through line A-A of FIG. 7A. The substrate 150 and first layer 152, as well as any of the insulating layers shown in FIGS. 8A and 8B through 15A and 15B, may be fabricated from any of the insulating materials discussed above with respect to the embodiment of FIG. 1. For example, the substrate 150 and first layer 152 may be fabricated from a stretchable TPU or epoxy-based material. The substrate 150 may generally be an uninterrupted sheet of material, whereas the first layer 152 of insulating material and the release layer 154 have a pattern of passages 156 and 158, in this example channels, cut through their entire thicknesses to create a mask or stencil. The release layer 154, which may be thinner than the first layer, is stacked on the first layer 152, and may be fabricated from any of the insulating materials discussed above with respect to the embodiment of FIG. 1. For example, the release layer 154 may be fabricated from a thin layer of PET. In embodiments in which the release layer 154 is eventually removed, it may also be fabricated from conductive materials including alloys or pure forms of metals, as well as metalized plastics or other conductive materials.

The passages 156 and 158 may be formed in the first layer 152 of insulating material and the release layer 154 using any suitable subtractive technique such as laser cutting, drilling, routing, die cutting, water-jet cutting, etc. In other embodiments, the first layer 152 and/or the release layer may be formed by an additive manufacturing technique such as 3-D printing, pattern deposition, etc.

Figure 8A:
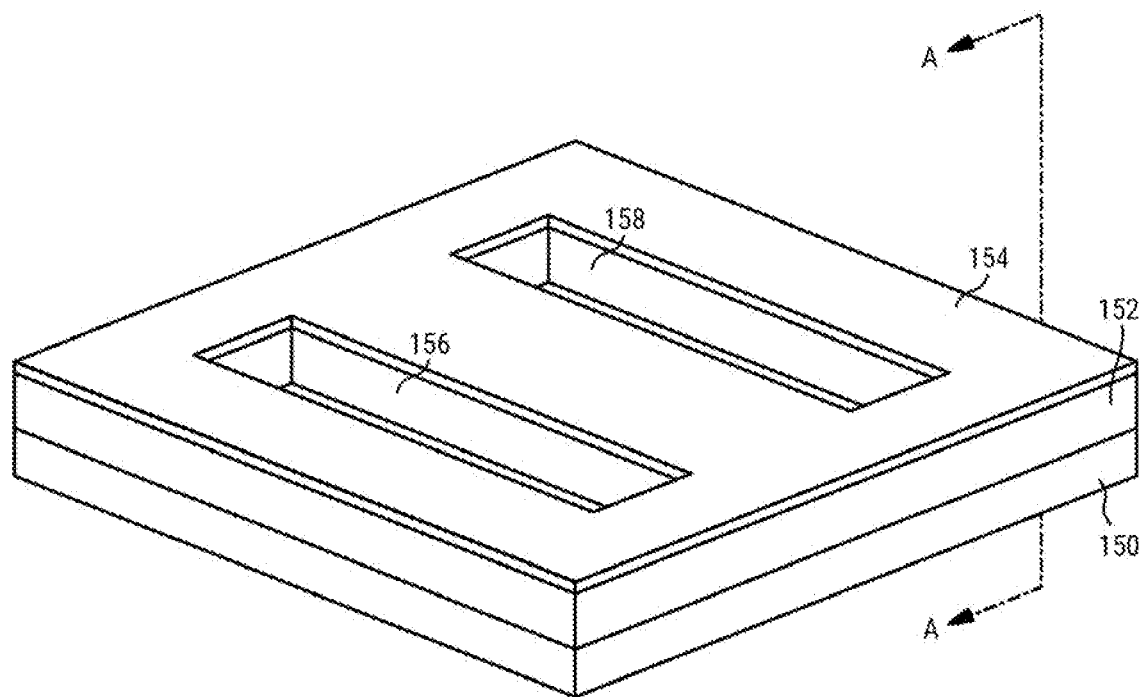
Figure 8B:
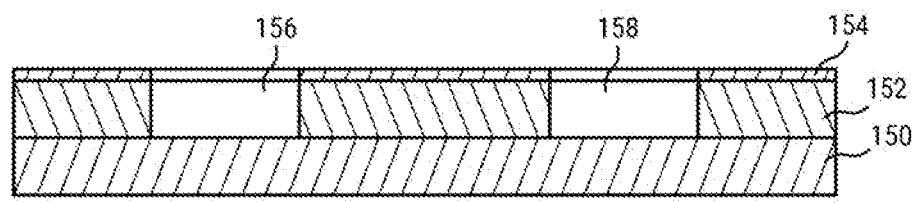

FIG. 8A is a perspective view of the substrate 150 and first layer 152 of insulating material after the first layer has been stacked on the substrate. FIG. 8B is a cross-sectional view taken through line A-A of FIG. 8A. The substrate 150 and first layer 152 of insulating material may be bonded, fused or cured together, or otherwise attached to each other with any suitable processes and/or materials. For example, if the substrate 150 and first layer 152 are fabricated from TPU or other thermoplastic, they may be bonded together with heat and pressure. As another example, if the substrate 150 and first layer 152 are fabricated from an inherently adhesive material such as some epoxy-based materials, they may be bonded together by pressing the layers together. In yet another example, the substrate 150 and first layer 152 may be fabricated from a UV-curable and exposed to a UV light source after stacking. The stacking and bonding of the two layers may close off the bottoms of the channels 156 and 158 so there is little or no leakage when they are filled with material.

Figure 9A:
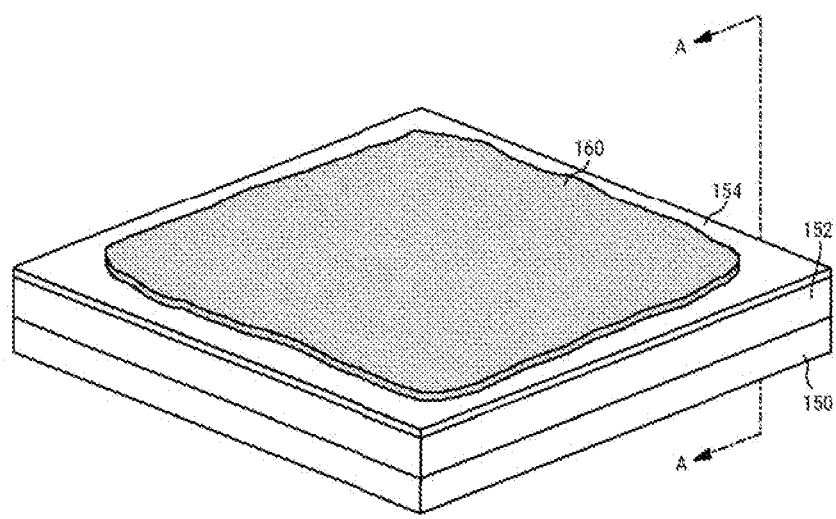

FIG. 9A is a perspective view of the substrate 150, first layer 152 of insulating material, and release layer 154 after the channels 156 and 158 have been over-filled with deformable conductive material 160.

Figure 9B:
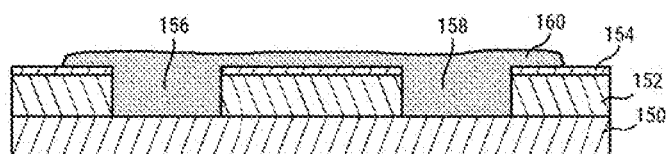

Referring to FIGS. 9A and 9B, the channels 156 and 158 have been over-filled with deformable conductive material 160, which may be implemented with any of the deformable conductive material discussed above with respect to the embodiment of FIG. 1. For example, a conductive gel may be used as the deformable conductive material. The material may be over-filled using any suitable technique such as extruding, rolling, swabbing, spraying, printing, brushing, deposition, etc. In one example embodiment, the material may be over-filled using a cotton swab to work the deformable conductive material completely into the channels 156 and 158.

Figure 10A:
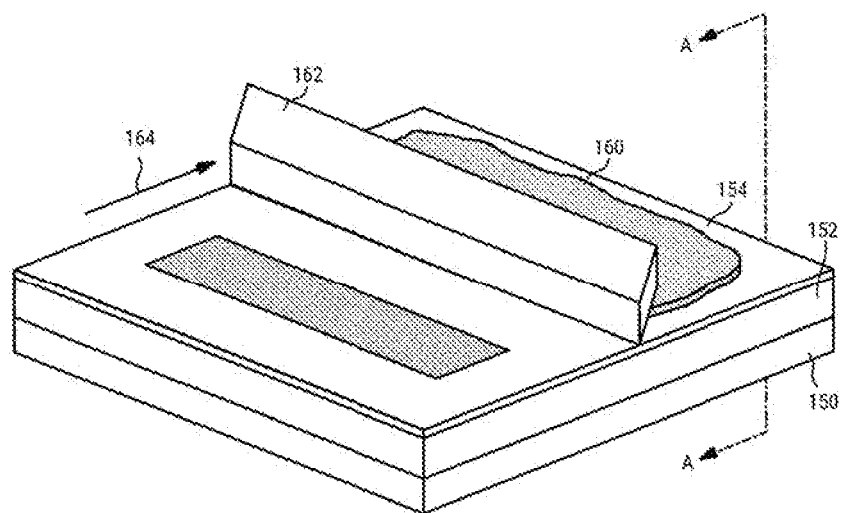
Figure 10B:
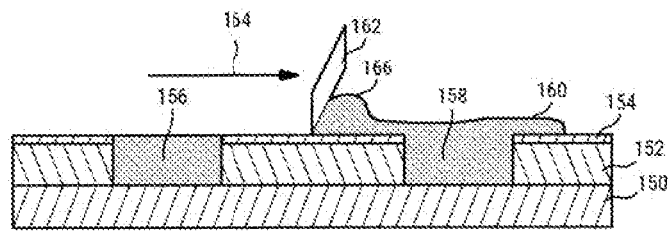

Referring to FIGS. 10A and 10B, excess deformable conductive material 160 may be removed from the surface of the release layer 154 by scraping with a tool 162 as shown by arrow 164. This may cause excess material to form a mound 166 in front of the tool 162 which may help fill any under-filled areas of the channels 156 and 158. Excess material may be discarded or recycled for use with other assemblies. Examples of items that may be used for the tool 162 include a straight-edge ruler, squeegee, spatula, scraper blade, etc. In other embodiments, alternative techniques may be used to remove excess deformable material such as rolling, brushing, etching, etc. In one example embodiment, a roller that is preloaded with deformable conductive material may be used to both apply the material and remove excess material by squeezing it out from under the roller in a single step.

Figure 11A:
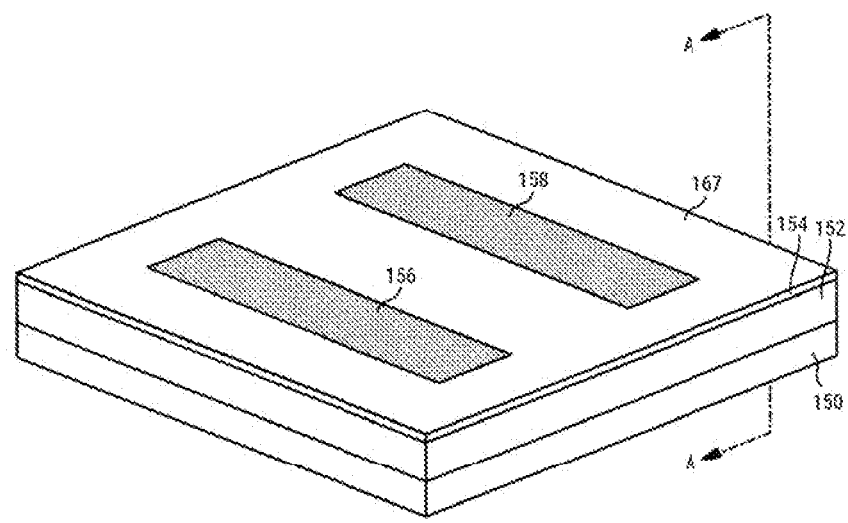
Figure 11B:
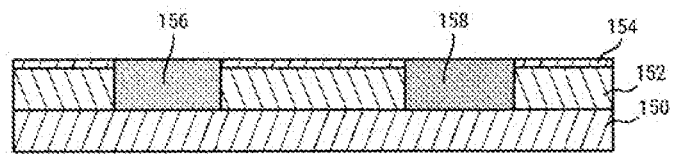

Referring to FIGS. 11A and 11B, the deformable conductive material is shown generally flush with the top surface 167 of the release layer 154 with all or most excess material removed. Depending on the technique used to remove excess material, there may still be thin patches of deformable conductive material remaining on the top surface of the release layer 154. Thus, the release layer may be removed by, for example, peeling it off to leave a clean top surface 168 on the first layer 152 of insulating material as shown in FIGS. 12A and 12B.

Figure 12A:
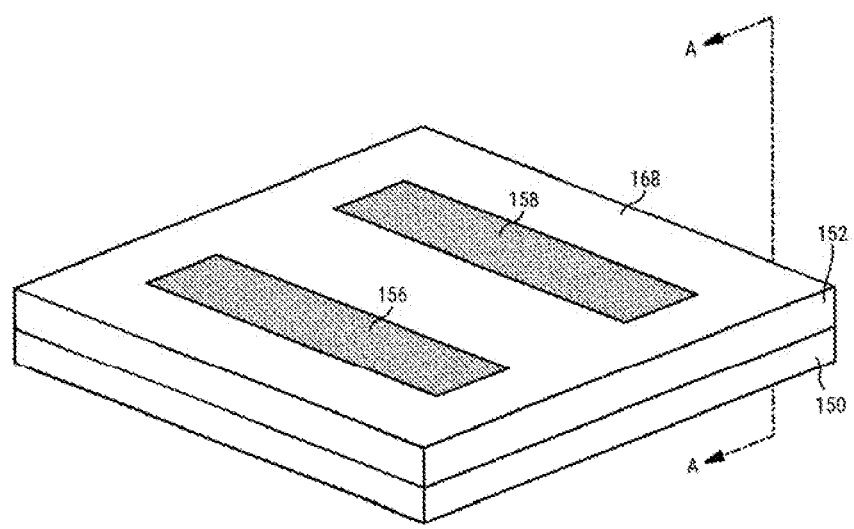
Figure 12B:
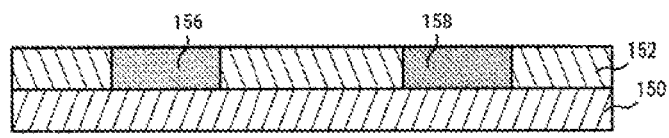

The deformable conductive material 160 in channels 156 and 158 is shown generally flush with the top surface 168 of the first layer 152 of insulating material in FIGS. 12A and 12B. This may be accomplished by using a release layer that is thin enough (e.g., a few microns or tens of microns, or a few thousandths of an inch thick) that the remaining deformable conductive material is effectively flush. (In some embodiments, the thickness of the release layer 154 may be exaggerated in the views of FIGS. 7A and 7B through 11A and 11B.) In some embodiments, if even a small amount of protrusion needs to be avoided, a small amount of the deformable conductive material 160 may be removed from the channels 156 and 158 by scraping, brushing, etc. prior to removal of the release layer 154, thereby leaving the deformable conductive material 160 flush with the top surface 168 of the first layer 152 of insulating material.

In some embodiments, it may be beneficial to have the deformable conductive material 160 slightly proud of the surface. In some embodiments, the thickness of the release layer 154 may purposely be set to a value that may cause the deformable conductive material 160 to protrude above the top surface 168 of the first layer 152 of insulating material by a predetermined amount.

The structure illustrated in FIGS. 12A and 12B has utility as fabricated, or as a base for additional layers. For example, as fabricated, it may be used as a pattern of contact pads to engage the terminals of an electric device that may be mounted on, or supported by, the first layer 152 as described above with respect to FIGS. 1 through 6. In such an application, it may be beneficial for the deformable conductive material 160 to protrude above the top surface 168 of the first layer 152 of insulating material, for example to better engage the terminals of the electric device. The pattern of conductive channels 156 and 158 may be modified to include different numbers, sizes, shapes, etc. of conductive passageways to function as contact points and/or traces.

As fabricated, the embodiment illustrated in FIGS. 12A and 12B, or with a modified pattern of passageways, may also be used as a circuit element itself. For example, the channels 156 and 158 filled with deformable conductive material 160 may function as a transmission line such as a strip line or in circuit capacitor. In such an implementation, a layer of encapsulant may be formed over the top of the layer 152 to enclose and protect the deformable conductive material 160.

Figure 13A:
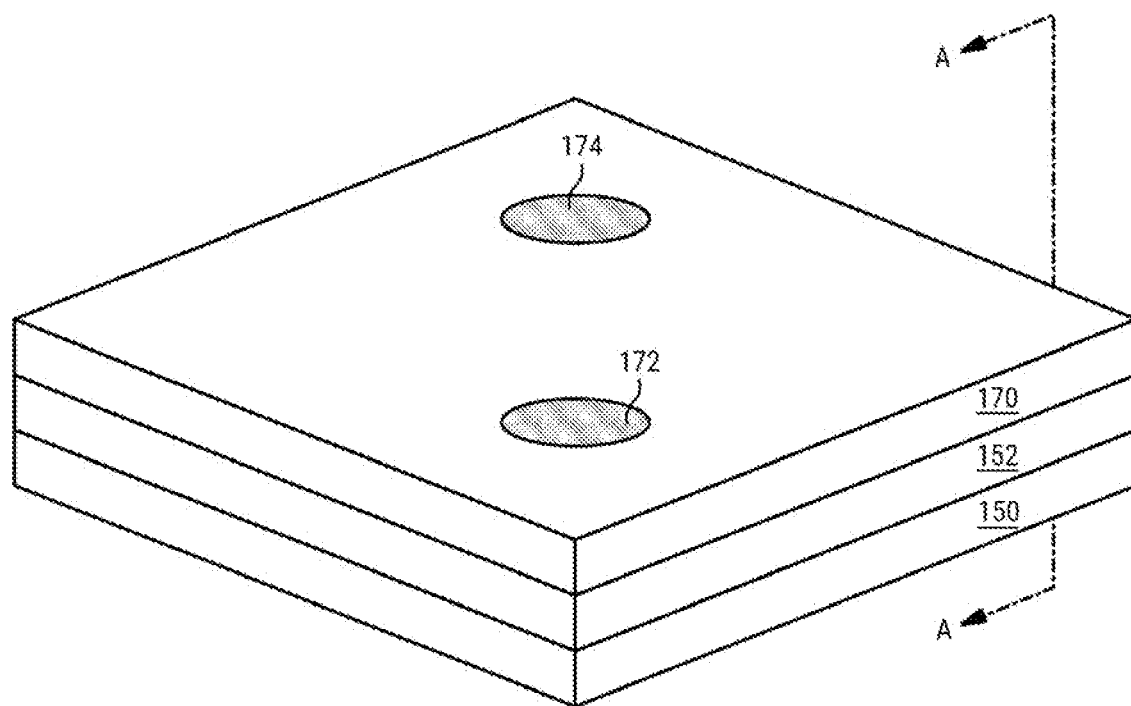
Figure 13B:
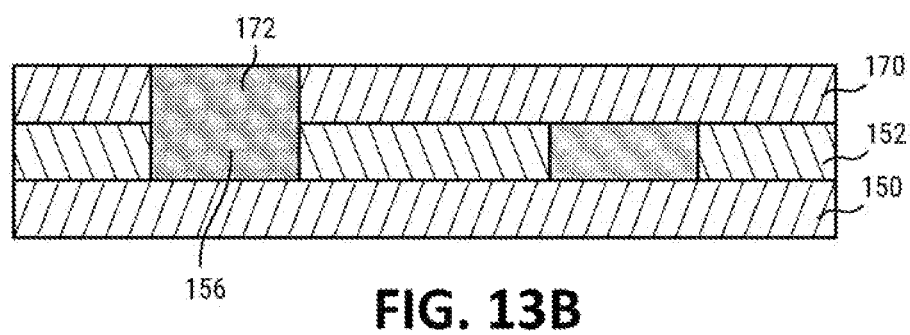

As mentioned above, the structure as illustrated in FIGS. 12A and 12B, or with a modified pattern of passageways, may also be used as a base for additional layers. For example, referring to FIGS. 13A and 13B, a second layer 170 of insulating material may be stacked on top of the first layer 152. The second layer 170 may have a pattern of passages, at least one of which communicates with one or more of the passages in the first layer 152. In the example of FIGS. 13A and 13B, the pattern includes through vias 172 and 174 that align with the traces formed by channels 156 and 158, respectively, in the first layer 152. Other parts of the second layer 170 may serve to enclose the deformable conducive material within portions of the channels 156 and 158 in the first layer 152. The second layer 170 and vias 172 and 174 may be formed and attached using any of the materials and techniques disclosed for the first layer 152, including the user of a release layer. For brevity, the intermediate steps in which the second layer 170 is formed and attached are not illustrated, and the second layer is shown in its final form in FIGS. 13A and 13B.

As is visible in FIG. 13B, the via 172 in the second layer 170 aligns and communicates with a portion of channel 156 in the first layer 152. Thus, when the via 172 is filled with deformable conductive material, it forms a continuous conductive structure with the channel 156.

The vias 172 and 174 in the second layer 170 may serve numerous functions. For example, they may function as contact points for one or more electric devices, they may function as circuit elements themselves, for example as a transmission line or sensor, they may electrically connect the traces formed by channels 156 and 158 in the first layer 152 with traces in another layer above the second layer, etc. The pattern of vias 172 and 174 shown in FIGS. 13A and 13B is merely one example, and the pattern may be modified to include any number, shape, arrangement, etc., of conductive passageways.

Figure 14A:
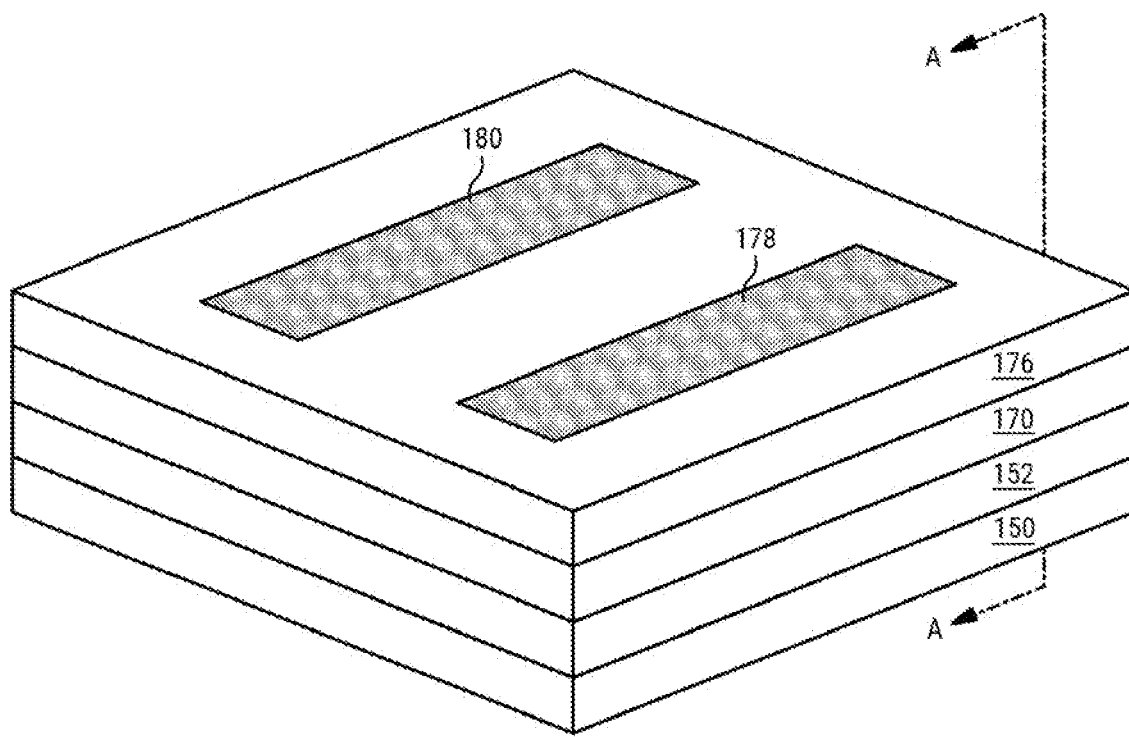
Figure 14B:
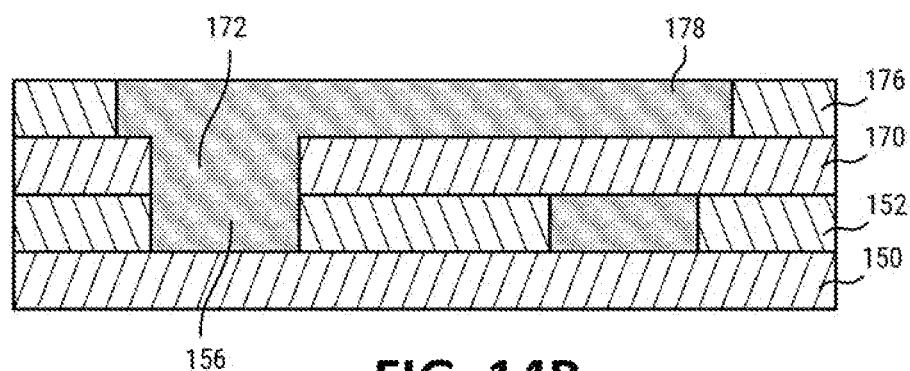

Referring to FIGS. 14A and 14B, a third layer 176 of insulating material may be stacked on the second layer 170 of insulating material. The third layer 176 may have a pattern of passages, at least one of which communicates with one or more of the passages in the second layer 170. In the example of FIGS. 14A and 14B, the pattern includes channels 178 and 180 that align with the vias 172, and 174, respectively, in the second layer 170. The third layer 176 and channels 178 and 180 may be formed and attached using any of the materials and techniques disclosed for the first and second layers 152 and 170, including the user of a release layer. For brevity, the intermediate steps in which the third layer 176 is formed and attached are not illustrated, and the third layer is shown in its final form in FIGS. 14A and 14B.

As with the patterns of passages in the first and second layers 152 and 170, the pattern of channels 178 and 180 in the third layer 176 may serve numerous functions. For example, they may function as contact points for one or more electric devices, they may function as circuit elements themselves, for example as a transmission line or sensor, they may function as traces that are electrically connected to the vias 172 and 174 in the second layer 170, etc. The pattern of channels 178 and 180 shown in FIGS. 14A and 14B is merely one example, and the pattern may be modified to include any number, shape, arrangement, etc., of conductive passageways.

Figure 15A:
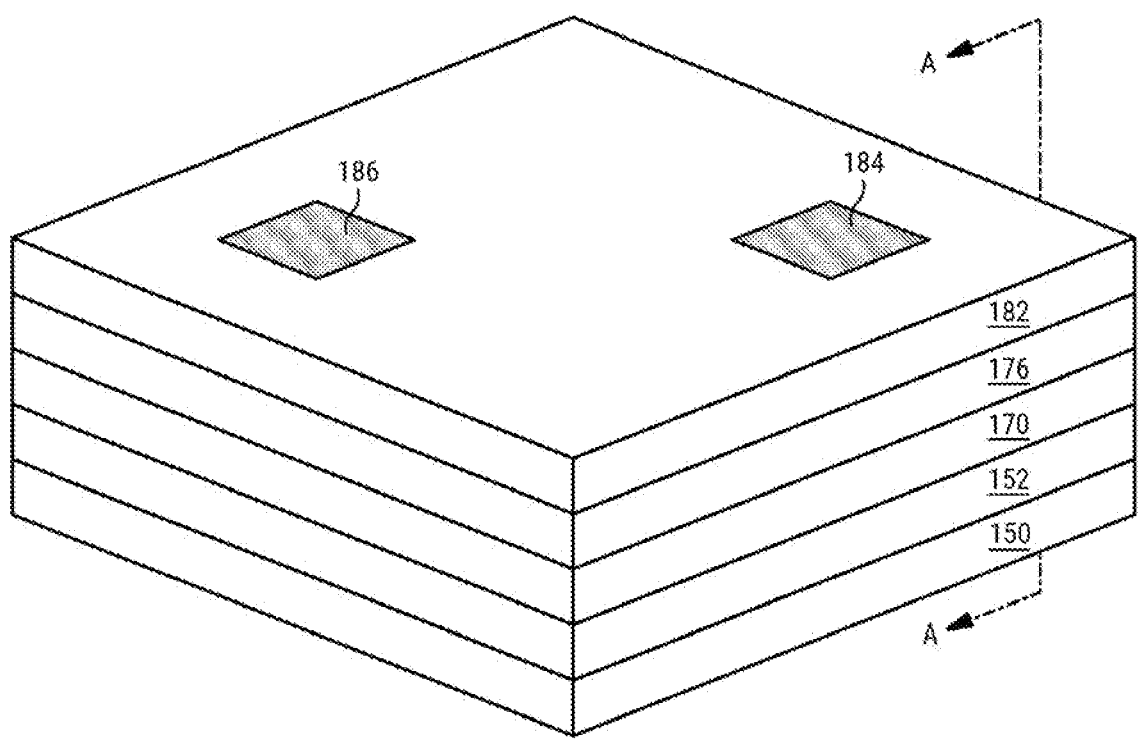
Figure 15B:
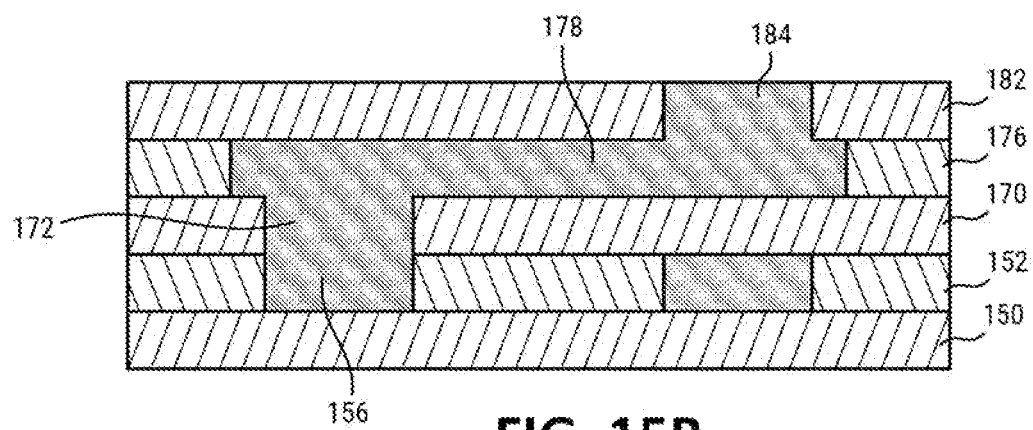

Referring to FIGS. 15A and 15B, a fourth layer 182 of insulating material may be stacked on the third layer 176 of insulating material. The fourth layer 182 may have a pattern of passages, at least one of which communicates with one or more of the passages in the third layer 176. In the example of FIGS. 15A and 15B, the pattern includes pads 184 and 186 that align with the channels 178 and 180, respectively, in the third layer 176. Other parts of the fourth layer 182 may serve to enclose the deformable conducive material within portions of the channels 178 and 180 in the third layer 176. The fourth layer 182 and pads 184 and 186 may be formed and attached using any of the materials and techniques disclosed for the first, second, and third layers 152, 170 and 176, including the user of a release layer. For brevity, the intermediate steps in which the fourth layer 182 is formed and attached are not illustrated, and the fourth layer is shown in its final form in FIGS. 15A and 15B.

As with the patterns of passages in the other layers, the pattern of pads 184 and 186 in the fourth layer 182 may serve numerous functions. For example, they may function as contact points for one or more electric devices, they may function as circuit elements themselves, for example as a transmission line or sensor, they may function as vias that electrically connect the channels 178 and 180 in the third layer 182, to passages in additional layers above the fourth layer 182, they may function as contact points for making "hard-to-soft" connections between hard external terminals and the deformable conductive material, etc. The pattern of pads 184 and 186 shown in FIGS. 15A and 15B is merely one example, and the pattern may be modified to include any number, shape, arrangement, etc., of conductive passageways.

As is visible in FIG. 15B, there is one continuous conductive path through the channel 156 in the first layer 152, the via 172 in the second layer 152, the channel 178 in the third layer 176 and the pad 184 in the fourth layer 182. The layers and passages in the embodiments shown in FIGS. 7A and 7B through 15A and 15B are for purposes of illustration only and may be modified to create any type of circuit arrangement. For example the order of the layers of vias and pads and layers with traces may be changed. Some layers may include both traces and vias and pads.

In some example embodiments, one or more of the insulating layers may be formed a TPU such as Lubrizol Estane 58000 series, for example, 58238 or a stretchable epoxy-based material. Strechable epoxy-based materials may also provide a self-adhesive surface for bonding electric components to the layer, and for bonding layers to each other. Other examples of materials with adhesive properties include some thermally activated adhesives like polyurethane (PU) adhesives (e.g., from Bemis or Framis), thermoset adhesives with different chemistry such as some silicones, acrylics or others, and any pressure sensitive adhesive of any chemistry, etc.

Such materials may result in embodiments of circuit assemblies that may be flexible and/or stretchable enough for use in clothing, medical electronics worn against or close to a patient's body, etc. In some embodiments, one or more release layers may be left in place on the surface of a layer of insulating material. In other embodiments, release layers may be omitted entirely. Although the passages shown in the embodiments of FIGS. 7A and 7B through 15A and 15B are generally shown extending the entire way through the layers of insulating materials, in other embodiments, some or all of the passages may only extend part of the way through one or more of the layers of insulating materials.

In some embodiments, electric components may be integrated into a stack of layers, for example, between layers. For example, one or more internal layers of a stack may have a cutout section to accommodate the height of a device such as an integrated circuit package. In some other embodiments, some components such as resistors and/or capacitors, as well as smaller IC packages and bare IC dies may be small enough to place between layers, especially if the layers are relatively soft and or pliable.

Figure 16:
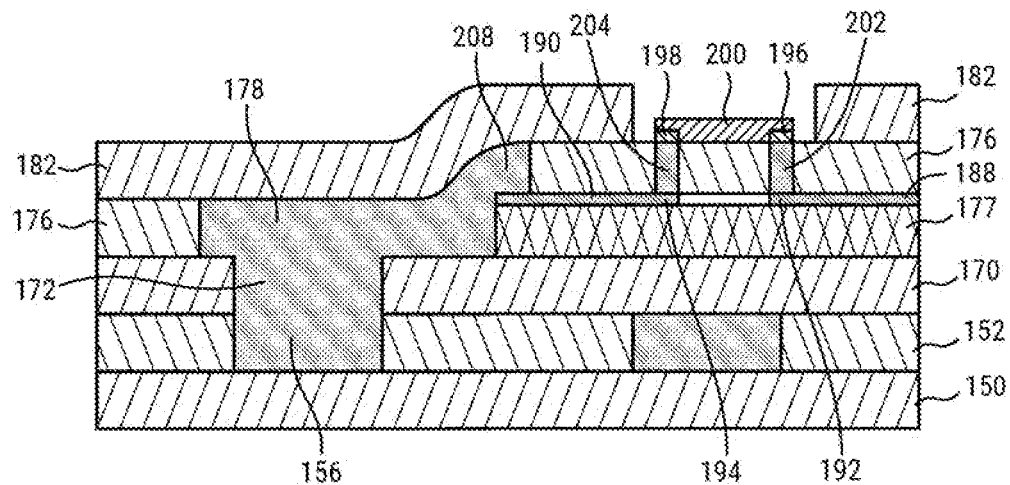
FIG. 16 is a cross-sectional view illustrating another embodiment of a circuit assembly according to some inventive principles of this patent disclosure.

FIG. 16 is a cross-sectional view illustrating another embodiment of a circuit assembly according to some inventive principles of this patent disclosure. For purposes of illustration, the embodiment of FIG. 16 is shown having layers similar to those in FIG. 15B, but the inventive principles are not limited to these details. The embodiment of FIG. 16 may include a layer, sublayer, or portion of a layer (referred to collectively as a "sublayer") 177 on or in which a pattern of conductive elements has been formed. In this example, the sublayer 177 is interposed between the second layer 170 and the third layer 176 over the right-hand portion of the stack. The third and fourth layers 176 and 182 are formed with a step to accommodate the sublayer 177. In other embodiments, the sublayer may replace a portion of a layer, an entire layer or be added as another entire layer. The sublayer 177 may be thinner, thicker or the same thickness as any of the other layers.

Any or all of the conductive elements on layer 177 may be formed from any of the deformable conductive materials disclosed above. The pattern of conductive elements may also include a mix of deformable and non-deformable conductive elements. The sublayer 177 may be fabricated from any of the insulating materials disclosed above and attached to other layers as described above. The pattern of elements may include traces, vias, pads, circuit elements including transmission lines and sensors, etc. The pattern of elements may be formed on the sublayer 177 through any of the techniques described above. In some embodiments, it may be beneficial to form some or all of the elements through a printing process such as a reel-to-reel (R2R) process. This may enable the creation of finer conductive elements to accommodate smaller electric components or interconnects, or to accommodate components or interconnects having generally different characteristics.

In the embodiment of FIG. 16, the sublayer 177 has a pattern including two traces 188 and 190 connected to pads 192 and 194 that align with terminals 196 and 198, respectively, on an electric component 200.

Vias 202 and 204 through the third layer 176 connect the pads 192 and 194 with the terminals 196 and 198, respectively. The electric component 200 in this example is shown as a bare integrated circuit die on which the terminals 196 and 198 are formed as bonding or contact pads, but any other type of electric component may be used. In this example, the IC die 200 is adhesively attached to the third layer 176, but it may be attached in any other manner.

The pattern of conductive elements formed on the sublayer 177 may be interconnected with any other traces, vias, pads, components, etc. In the example of FIG. 16, trace 190 on sublayer 177 is electrically connected to trace 178 in layer 176 through hybrid trace/via 208 formed in the step portion of layer 176 which accommodates the thickness of the sublayer 177. In other embodiments, the portion of layer 176 over the sublayer 177 may be omitted, and the fourth layer 182 may be formed on a plane formed by the remaining portion of layer 176 and the sublayer 177.

Figure 17:
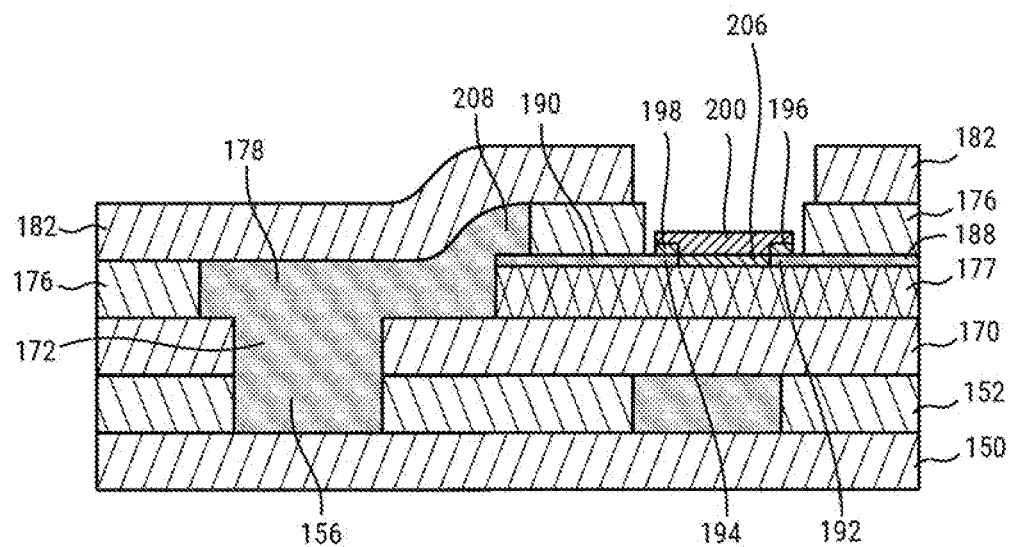
FIG. 17 is a cross-sectional view illustrating another embodiment of a circuit assembly according to some inventive principles of this patent disclosure.

FIG. 17 is a cross-sectional view illustrating another embodiment of a circuit assembly according to some inventive principles of this patent disclosure. The embodiment of FIG. 17 is similar to that of FIG. 16, but the entire portion of the third layer 176 under the IC die 200 is omitted, as are the vias 202 and 204. The IC die is attached to the top surface of sublayer 177 with a layer of adhesive 206, and the bonding or contact pads 196 and 198 directly contact the pads 192 and 194, respectively, which are formed from deformable conductive material.

Figure 18:
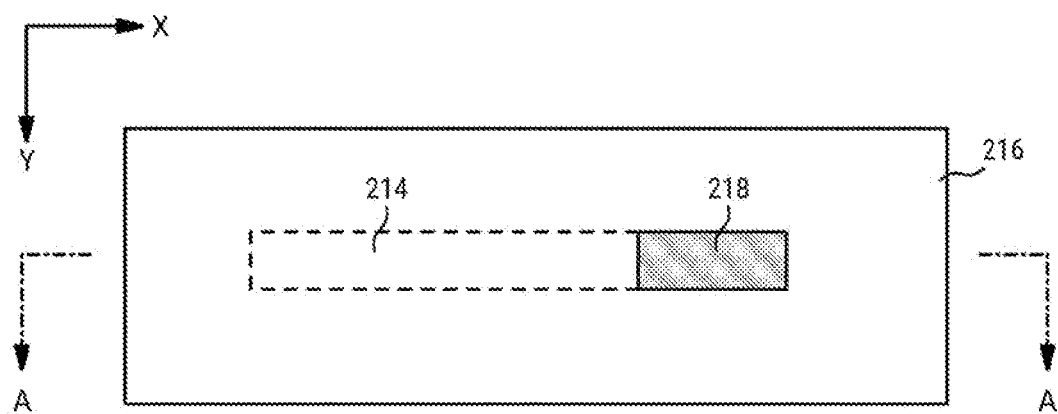
FIGS. 18 and 19 are a plan view and a cross-sectional view-, respectively, of a via structure according to some inventive principles of this patent disclosure.
Figure 19:
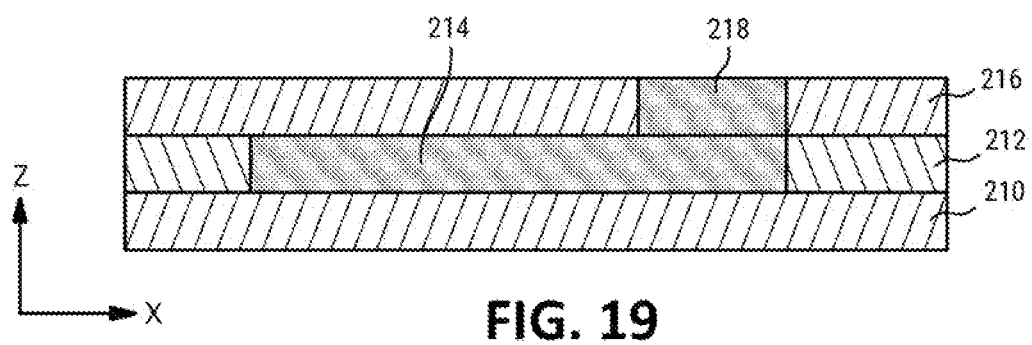

FIG. 18 is a plan view of a via structure according to some inventive principles of this patent disclosure. FIG. 19 is a cross-sectional view taken along line A-A in FIG. 18. The embodiment of FIGS. 18 and 19, which may utilize any of the materials and fabrications techniques described above, includes a substrate 210, and first and second layers 212 and 216 of insulating material stacked on the substrate 210. The first layer 212 includes a trace 214. The second layer includes a via 218 formed over, and communicating with, the trace 214. As shown in FIG. 18, the via 218 has an extended length in the X axis (as compared to the Y axis) which may be an axis along which the assembly of FIG. 18 is subjected to a strain, a shear force, and/or a stretching deformation. By extending the length of the via along the X axis, it may provide a more robust connection between the via 218 and the trace 214 which may tend to slide past each other when the assembly may be stretched along the X axis.

The technique of extending a conductive element in a direction of expected stretch is illustrated in the context of a via in FIGS. 18 and 19, but it may also be applied to any other passages, interconnects or structures. In some embodiments, other aspects of the relative sizes and shapes of vias, traces, and other features may be adjusted to accommodate stretching. For example, in some embodiments, vias may have a diameter that is about half the trace width.

Embodiments constructed according to the inventive principles of this patent disclosure may result in highly functional circuit assemblies that may reduce the cost of the assembly since they may allow for the use of less expensive unpackaged electronic devices and also eliminate soldering steps. Embodiments constructed according to the inventive principles of this patent disclosure may also provide improved reliability because the elimination of solder may reduce the heating associated with soldering and may also provide improved cooling by eliminating device packaging which may serve as a barrier to heat dissipation.

Since the inventive principles of this patent disclosure can be modified in arrangement and detail without departing from the inventive concepts, such changes and modifications are considered to fall within the scope of the following claims. The use of terms such as first and second are for purposes of differentiating different components and do not necessarily imply the presence more than one component.

The invention claimed is:
1. A circuit assembly comprising:
a substrate layer;
a first insulator layer, positioned on the substrate layer, forming a pattern of channels;
conductive gel, positioned within the pattern of channels;
a second insulator layer, positioned on the first insulator layer and encapsulating the conductive gel within the pattern of channels and forming a plurality of contact points electrically coupled to the pattern of channels, the plurality of contact points including the conductive gel; and an electric component coupled to the second insulator layer and having terminals operatively coupled to the plurality of contact points.

2. The circuit assembly of claim 1, wherein the plurality of contact points extend through the substrate layer to a surface of the substrate layer.

3. The circuit assembly of claim 1, wherein the electric component is physically coupled to a surface of the second insulator layer.

4. The circuit assembly of claim 3, wherein the second insulator layer comprises an adhesive that physically couples the electric component to the surface of the second insulator layer.

5. The circuit assembly of claim 1, wherein the plurality of contact points are recessed in the second insulator layer.

6. The circuit assembly of claim 1, wherein the substrate layer and the first and second insulator layers are comprised of a stretchable material.

7. The circuit assembly of claim 6, wherein the stretchable material is the same for the substrate layer and the first and second insulator layers.

8. The circuit assembly of claim 7, wherein the substrate layer is comprised of thermoplastic polyurethane.

9. The circuit assembly of claim 1, wherein the plurality of contact points are formed from vias in the second insulator layer.

10. The circuit assembly of claim 1, wherein the plurality of contact points further comprises a conductive metal electrically coupling to the terminals.

11. The circuit assembly of claim 10, wherein the conductive gel forms a pattern of conductive traces within the pattern of channels.

12. The circuit assembly of claim 11, wherein the pattern of conductive traces are interconnected with the plurality of contact points.

13. The circuit assembly of claim 1, further comprising a rigid material coupled to one of the substrate layer or one of the first and second insulator layers, the rigid material having greater rigidity than the one of the substrate layer or one of the first and second insulator layers to which it is coupled, and wherein the electric component is attached to the rigid material.

14. The circuit assembly of claim 13, wherein the rigid material is comprised of a less-stretchable material than that of the one of the substrate layer or one of the first and second insulator layers to which it is coupled.

15. A method of making a circuit assembly comprising:
positioning a first insulator layer on a substrate layer, the first insulator layer forming a pattern of channels;
positioning conductive gel within the pattern of channels;
positioning a second insulator layer on the first insulator layer, the second insulator layer encapsulating the conductive gel within the pattern of channels and forming a plurality of contact points electrically coupled to the pattern of channels, the plurality of contact points including the conductive gel; and
supporting an electric component by the second insulator layer and having terminals operatively coupled to the plurality of contact points.

16. The method of claim 15, further comprising extending the plurality of contact points through the substrate layer to a surface of the substrate layer.

17. The method of claim 15, further comprising physically coupling the electric component to a surface of the second insulator layer.

18. The method of claim 17, wherein the second insulator layer comprises an adhesive that physically couples the electric component to the surface of the second substrate layer.

19. The method of claim 15, further comprising recessing the plurality of contact insulator points in the second insulator layer.

20. The method of claim 15, wherein the substrate layer and the first and second insulator layers are comprised of a stretchable material.

* * * * *